United States Patent [19]

Nakamura et al.

[11] Patent Number: 4,820,610

[45] Date of Patent: Apr. 11, 1989

[54] PROCESS FOR PREPARATION OF LIGHT-SENSITIVE COMPOSITION POLYMERIZABLE COMPOSITION CONTAINING A SILVER HALIDE IN-WATER EMULSION

[75] Inventors: Taku Nakamura; Tsumoru Hirano; Eiji Funatsu, all of Kanagawa, Japan

[73] Assignee: Fuji Photo Film Co., Ltd., Kanagawa, Japan

[21] Appl. No.: 198,355

[22] Filed: May 25, 1988

Related U.S. Application Data

[63] Continuation-in-part of Ser. No. 933,515, Nov. 21, 1986, abandoned.

[30] Foreign Application Priority Data

Nov. 21, 1985 [JP] Japan .................................. 60-261887

[51] Int. Cl.$^4$ .............................................. G03C 1/76
[52] U.S. Cl. ...................................... 430/270; 430/138; 430/251; 430/264; 430/281; 430/905

[58] Field of Search ............... 430/270, 281, 264, 251, 430/138, 905, 909, 310

[56] References Cited

U.S. PATENT DOCUMENTS

| | | | |
|---|---|---|---|
| 4,287,290 | 9/1981 | Mizuno et al. | 430/202 |
| 4,557,997 | 12/1985 | Iwasaki et al. | 430/281 |
| 4,560,637 | 12/1985 | Maeda et al. | 430/202 |
| 4,649,098 | 3/1987 | Takeda | 430/281 |

*Primary Examiner*—Jack P. Brammer
*Attorney, Agent, or Firm*—Sughrue, Mion, Zinn, Macpeak & Seas

[57] ABSTRACT

A light-sensitive liquid composition in which droplets of a silver halide emulsion are dispersed in a polymerizable compound, characterized in that a polymer having a principal chain consisting essentially of a hydrocarbon chain substituted in part with hydrophilic groups which contain, in their terminal groups, -OH or nitrogen having a lone electron-pair is dissolved in the polymerizable compound. Process for the preparation thereof is also disclosed.

14 Claims, No Drawings

PROCESS FOR PREPARATION OF LIGHT-SENSITIVE COMPOSITION POLYMERIZABLE COMPOSITION CONTAINING A SILVER HALIDE IN-WATER EMULSION

This application is a continuation-in-part of application Ser. No. 06/933,515 filed Nov. 21, 1986, now abandoned.

FIELD OF THE INVENTION

This invention relates to a process for the preparation of a light-sensitive composition comprising droplets of silver halide emulsion dispersed in a polymerizable compound.

BACKGROUND OF THE INVENTION

Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143 describe light-sensitive materials which comprises a support and a light-sensitive layer containing silver halide, a reducing agent and a polymerizable compound and which are employed in image forming methods in which an image is formed on a portion of silver halide latent image through polymerization of the polymerizable compound by action of the reducing agent. These light-sensitive materials can be also used in image forming methods employing a dry process which are described in Japanese Patent Provisional Publication Nos. 61(1986)-69062 and 61(1986)-73145 (the contents thereof are described in U.S. Pat. No. 4,629,676 and European Patent Provisional Publication No. 0174634A2), 61(1986)-183640, 61(1986)-188535 and 61(1986)-228441 (the contents thereof are described in U.S. Pat. Ser. No. 827,702).

In these light-sensitive materials, silver halide is preferably contained in oil droplets of the polymerizable compound or microcapsules containing the polymerizable compound to improve sensitivity of the light-sensitive material and sharpness of the obtained image. In the oil droplets and microcapsules, it is preferred that droplets of the silver halide emulsion are finely dispersed in the polymerizable compound. A method for emulsifying the silver halide emulsion in an organic medium such as an organic solvent containing hydrophobic binder is stated in Research Disclosure No. 18755 (1979). But, fineness of droplets of the silver halide emulsion in the resulting emulsion is not sufficiently satisfactory.

SUMMARY OF THE INVENTION

An object of the present invention is to provide a process for preparation of a light-sensitive composition wherein droplets of the silver halide emulsion are finely dispersed in a polymerizable compound.

Another object of the invention is to provide a light-sensitive composition showing improved sensitivity.

There is provided by the present invention a process for the preparation of a light-sensitive composition in which droplets of a silver halide-in-water emulsion are dispersed in an ethylenically unsaturated polymerizable liquid compound, which comprises the steps of: dissolving a polymer in the polymerizable compound to prepare a solution, said polymer having a principal chain consisting essentially of a hydrocarbon chain substituted in part with hydrophilic groups which contain, in their terminal groups, —OH or nitrogen atom having a lone electron-pair, and said polymer being used in an amount of 0.01 to 2 weight % based on the amount of the polymerizable compound; and emulsifying the silver halide-in-water emulsion in the solution, said silver halide-in-water emulsion being used in such amount that the amount of the polymerizable compound is in the range of 5 to 120,000 times by weight the amount of silver halide contained in the silver halide-in-water emulsion.

The process of the invention comprises dissolving a polymer in the polymerizable compound to prepare a solution, and emulsifying the silver halide-in-water emulsion in the solution.

The polymer has a function of dispersing droplets of silver halide emulsion in the polymerizable compound very finely as well as a function of keeping thus dispersed state. Therefore the light-sensitive material prominently improved in the sensitivity can be prepared using the light-sensitive composition.

Further, the polymer shows an additional function of gathering silver halide along the interface between the silver halide emulsion and the polymerizable compound, because —OH and nitrogen having a lone electron-pair in the terminal group of the hydrophilic group is supposed to serve as a ligand of silver halide. The function of —OH and nitrogen having a lone electron-pair as a ligand of silver is described in detail in T. James, "The Theory of the Photographic Process", 4th edition, 8–9 (1966) and Research Disclosure No. 17643 (1978). The silver halide gathering along the interface between the silver halide emulsion and the polymerizable compound more easily and efficiently receives light energy applied to the light-sensitive composition. Therefore, the light-sensitive composition shows improved light-sensitivity.

DETAILED DESCRIPTION OF THE INVENTION

The polymer used in the light-sensitive composition of the invention has a principal chain consisting essentially of a hydrocarbon chain substituted in part with hydrophilic groups which contain, in their terminal groups, —OH or nitrogen having a lone electron-pair.

The number of hydrophilic groups in th polymer can be chosen in consideration of the solubility of the polymer in the polymerizable compound and the dispersing ability for the silver halide. In the case that the polarity of the polymerizable compound is high, the number of hydrophilic groups in the polymer can be increased. In the case that the polarity of the polymerizable compound is low, the number of hydrophilic groups is preferably made small. Generally, the hydrophilic groups in the polymer are preferably present in number of at least 0.25% based on the number of carbon atoms contained in the principal chain. The hydrophilic groups are more preferably present in number of at least 0.5%, and most preferably present in number of at least 1%.

Examples of the terminal groups of the hydrophilic groups include those of the following formula (I):

(I)

in which each of $R^1$ and $R^2$ individually is hydrogen or a substituent group, and $R^1$ and $R^2$ totally contain not more than 5 carbon atoms.

Examples of the $R^1$ and $R^2$ in the formula (I) individually include —COR$^3$ in which $R^3$ is a substituent group containing not more than 4 carbon atoms, —SO$_2$R$^4$ in which $R^4$ is a substituent group containing not more than 5 carbon atoms, an alkyl group containing not more than 5 carbon atoms, and a substituted alkyl group containing not more than 5 carbon atoms.

Alternatively, $R^1$ and $R^2$ can form, together with the neighboring nitrogen, a 5- or 6-membered heterocyclic group.

Examples of the 5- or 6-membered nitrogen-containing heterocyclic group are described below.

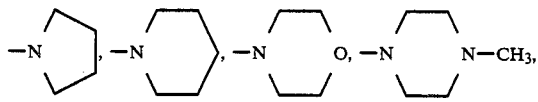

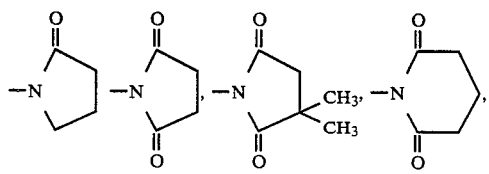

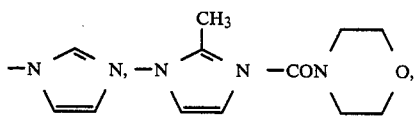

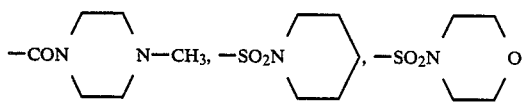

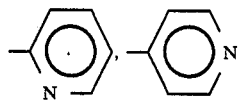

The repeating units can be repeating units having a hydrophilic group which has the formula (II):

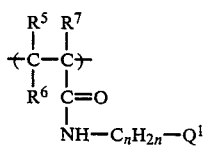
(II)

in which each of $R^5$, $R^6$ and $R^7$ individually is hydrogen or methyl; n is an integer of 1 to 6; and $Q^1$ is a monovalent group selected from the group consisting of hydroxyl, amino, an amino group substituted with one or two alkyl groups containing 1-6 carbon atoms, hydroxyphenyl, a 5- or 6-membered nitrogen-containing heterocyclic group, —COCH$_3$ and —NHSO$_2$CH$_3$.

The repeating units can be repeating units having a hydrophilic group which has the formula (III):

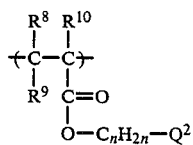
(III)

in which each of $R^8$, $R^9$ and $R^{10}$ individually is hydrogen or methyl; n is an integer of 1 to 6; and $Q^2$ is a monovalent group selected from the group consisting of hydroxyl, amino, an amino group substituted with one or two alkyl groups totally containing 1-5 carbon atoms, hydroxyphenyl, a 5- or 6-membered nitrogen-containing heterocyclic group and —NHSO$_2$CH$_3$.

In the formulas (II) and (III), n preferably is the integer of 2, 3 or 4; $Q^1$ preferably is a monovalent group such as hydroxyl, dimethylamino and —COCH$_3$; and $Q^2$ preferably is hydroxyl or dimethylamino.

Examples of the repeating units for constituting the polymers which are preferably used in the invention will be described hereinafter.

(P-1)

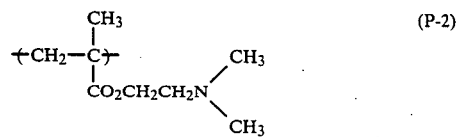
(P-2)

(P-3)

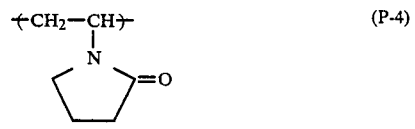
(P-4)

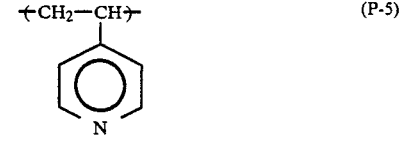
(P-5)

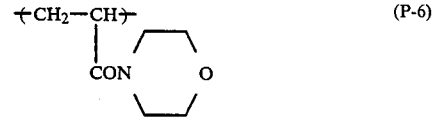
(P-6)

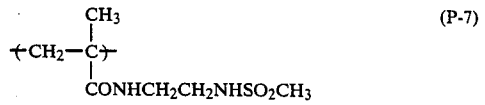
(P-7)

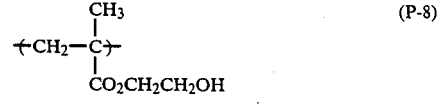
(P-8)

-continued

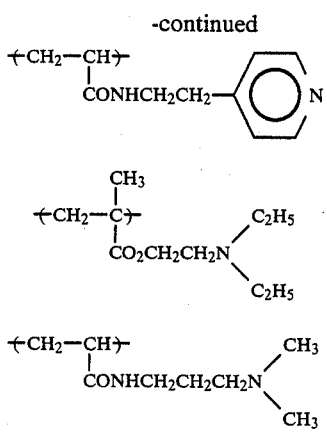

The polymer may be a copolymer comprising repeating units derived from a hydrophobic monomer in addition to repeating units having the hydrophilic group. The hydrophobic monomer preferably is an ethylenic unsaturated monomer having no hydrophilic group, such as an olefin, a vinyl ether, a vinyl ester, styrene, an acrylic ester, a methacrylic ester, an itaconic ester or a maleic ester.

Examples of the ethylenic unsaturated monomer include ethylene, butadiene, isobutylene, acrylonitrile, methyl vinyl ether, vinyl benzyl ether, vinyl acetate, vinyl propionate, styrene, vinyltoluene, chloromethylstyrene, p-chlorostyrene, methyl acrylate, ethyl acrylate, n-butyl acrylate, isobutyl acrylate, n-hexyl acrylate, cyclohexyl acrylate, 2-ethylhexyl acrylate, benzyl acrylate, tetrahydrofurfuryl acrylate, 2-methoxyethyl acrylate, methyl methacrylate, ethyl methacrylate, n-butyl methacrylate, isobutyl methacrylate, n-hexyl methacrylate, cyclohexyl methacrylate, 2-ethylhexyl methacrylate, benzyl methacrylate, tetrahydrofurfuryl methacrylate, furfurylmethacrylate, phenyl methacrylate, 2-methoxyethyl methacrylate, diethyl itaconate and dibutyl maleate. An ester of acrylic acid or mathacrylic acid and an alkyl alcohol containing 1–6 carbon atoms or the cycrohexyl alcohol is most preferred.

Examples of the repeating units of the copolymers which are preferably used as the polymers in the invention will be described hereinafter. In each formula, the repeating unit on the left side corresponds to the unit having hydrophilic group, and the repeating unit on the right side corresponds to the unit having hydrophobic group.

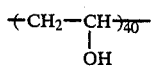 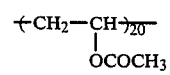 (P-12)

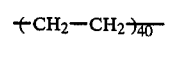 (P-13)
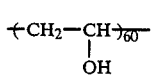

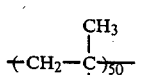 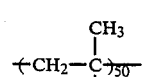 (P-14)

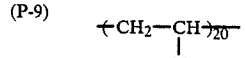 (P-15)

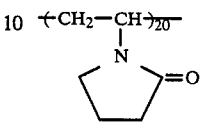 (P-16)

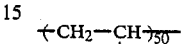

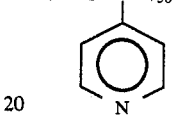

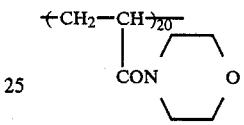 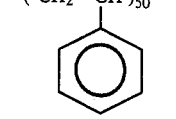 (P-17)

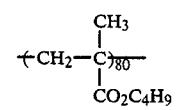 (P-18)

(P-19)

(P-20)

(P-21)

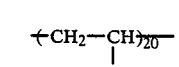 (P-22)

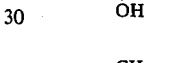

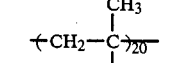 (P-23)

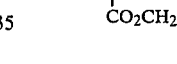

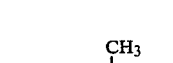 (P-24)

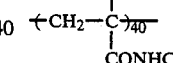

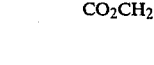 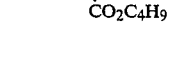

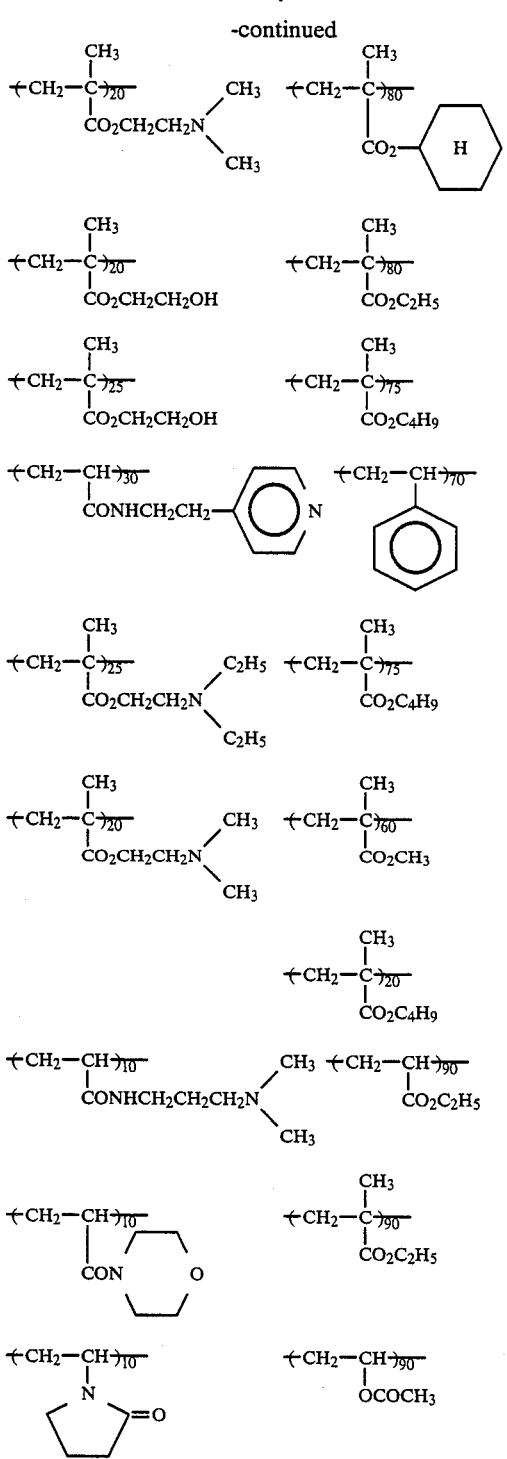

A preferred molecular weight of the polymer can be determined from the viewpoints of the viscosity and the dispersing ability of the solution wherein the polymer is dissolved in the polymerizable compound which serves as solvent or dispersing medium in the composition of the invention. Namely, the following should be considered for the determination of the molecular weight of the polymer: in the case that the molecular weight is too large, it may be difficult to stir sufficiently the solution in order to disperse silver halide in the composition because of the high viscosity of the solution, and that in the case that the molecular weight is too small, the dispersing ability for the silver halide is poor. The molecular weight of the polymer ordinarily ranges from 5,000 to 10,000,000, and preferably ranges from 10,000 to 2,000,000.

The polymer is used in an amount to 0.01 to 2 weight % (preferably 0.05 to 1 weight %) based on the amount of the polymerizable compound. The amount of the polymer preferably ranges from 0.1 to 20 weight % based on the silver halide emulsion, more preferably from 0.1 to 10 weight %, and most preferably from 0.5 to 5 weight %.

Some polymers as defined above are commercially available. Such and other polymers can be prepared by polymerization of the aforementioned monomers. The polymers can be also prepared by modification of various polymers using, for instance, hydrolysis or acetylation.

A synthesis example of the polymer for the copolymerization of the monomers is described below. Other polymers can be synthesized in the same manner as in this synthesis example.

SYNTHESIS EXAMPLE 1

Synthesis of N,N-dimethylaminoethyl methacrylate/methyl methacrylate/n-butyl methacrylate copolymer (P-30)

In a 300 ml, three-necked flask, 12.6 g of N,N-dimethylaminoethyl methacrylate, 24.0 g of methyl methacrylate, 11.4 g of n-butyl methacrylate and 190 ml of toluene were heated to 80° C.-under stirring. A solution of 0.298 g of 2,2'-azobis-(2,4-dimethylvaleronitrile) in 10 ml of toluene was added to the reaction mixture, and the mixture is further heated for 2 hours. Then the same amount of 2,2'-azobis-(2,4-dimethylvaleronitrile) was again added to the reaction mixture, and the mixture was further heated under stirring for 2 hours. The mixture was allowed to stand at room temperature, and was poured into 1 l of n-hexane. The produced precipitate was collected on a filter, washed with two 200 ml portions of n-hexane and dried to obtain 43.7 g (yield: 91%) of the desired polymer as white solid.

Silver halide and polymerizable compound contained in the light-sensitive composition of the invention are described hereinbelow.

There is no specific limitation with respect to the silver halide employed for the light-sensitive composition of the invention. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed.

There is no specific limitation on the crystal habit of silver halide grains. Two or more kinds of silver halide grains which differ in halogen composition, crystal habit, grain size, and/or other features from each other can be used in combination. There is no specific limitation on the grain size distribution of silver halide grains. The silver halide grains employed in the light-sensitive composition ordinarily have a mean size in the range of from 0.001 to 5 μm, preferably from 0.001 to 2 μm.

There is no specific limitation on the polymerizable compound, and any known polymerizable compounds including monomers, oligomers and polymers may be employed for the light-sensitive composition of the invention.

Preferred polymerizable compounds employable for the light-sensitive composition are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include compounds having an epoxy group. Among them, the compounds having an ethylenic unsaturated group are most preferred.

Examples of the compounds having an ethylenic unsaturated group include acrylic acid, salts of acrylic acid, acrylic esters, acrylamide, methacrylic acid, salts of methacrylic acid, methacrylic esters, methacrylamide, maleic anhydride, maleic esters, itaconic esters, styrene, styrene derivatives (e.g., divinyl benzene), vinyl ethers, vinyl esters, N-vinyl heterocyclic compounds, allyl ethers, allyl esters, and compounds carrying a group or groups corresponding to one or more of these compounds. Examples of the compounds having an epoxy group include glycidyl ethers (e.g., diglycidyl ether of bisphenol A, polyglycidyl ether of novolak, epoxidized oil, and epoxidazed polybutadiene).

Concreted examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compound can be used singly or in combination of two or more compounds. The viscosity of the polymerizable compound liquid can be easily adjusted using two or more compounds having different viscosity.

The amount of the polymerizable compound to be incorporated into the light-sensitive composition preferably ranges from 5 to $1.2 \times 10^5$ times (by weight) as much as the amount of silver halide, more preferably from 10 to $1 \times 10^4$ times as much as the amount of the silver halide.

The light-sensitive composition of the invention comprising the above-mentioned components can be used for the preparation of a light-sensitive material. Accordingly, the light-sensitive composition may further contain optional components such as reducing agents, color image-forming substances, sensitizing dyes, organic silver salts, various kinds of image formation accelerators (e.g., bases, base precursors, oils, surface active agents, hot-melt compounds), thermal polymerization inhibitors, thermal polymerization initiators, development-stopping agents, fluorescent brightening agents, fading inhibitors, antihalation dyes or pigments, antiirradiation dyes or pigments, matting agents, antismudging agents, plasticizers, water releasers, and binders.

Examples of the reducing agents (including compounds referred to as developing agents or hydrazine derivatives) employable for the preparation of light-sensitive materials are described in Japanese Patent Provisional Publication Nos. 61(1986)-183640, 61(1986)-188535 and 61(1986)-228441, and Japanese Patent Application Nos. 60(1985)-210657, 60(1985)-226084, 60(1985)-227527 and 60(1985)-227528. Examples of the color image forming substances are described in Japanese Patent Provisional Publication No. 61(1986)-73145. Examples of the sensitizing dyes are described in Japanese Patent Application No. 60(1985)-195407. Examples of the organic silver salts are described in Japanese Patent Application No. 60(1985)-141799. Examples of the bases and the base precursors are described in Japanese Patent Application No. 60(1985)-227528. Examples of the hot-melt compound are described in Japanese Patent Application No. 60(1985)-227527.

Examples of the other optional components which may be contained in the light-sensitive composition of the invention and their usages are also described in the above-mentioned publications and specifications concerning the light-sensitive materials.

The light-sensitive composition of the invention can be prepared, for instance, by the following process.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains or of an inner latent image type that forms a latent image predominantly in the interior of the grains. A direct reversal emulsion comprising an inner latent image type emulsion and a nucleating agent can be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, and cellulose sulfate; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole and copolymers comprising monomers constituting these homopolymers. Among them, gelatin is most preferred. Examples of the employable gelatin include not only lime-processed gelatin, but also acid-processed gelatin and enzyme-processed gelatin. Hydrolysis products and enzymatic decomposition products of gelatin can also be used.

In the formation of silver halide grains in the silver halide emulsion, ammonia, an organic thioether derivative as described in Japanese Patent Publication No. 47(1972)-11386 or a sulfur-containing compound as disclosed in Japanese Patent Provisional Publication No. 53(1978)-144319 can be used as silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride, can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion as described in Japanese Patent Application No. 60(1986)-139746. When the organic silver salts are introduced into the light-sensitive microcapsule, the emulsion of the organic silver salts can be prepared in the same manner as in the preparation of the silver halide emulsion.

The light-sensitive composition of the invention can be prepared using the above-mentioned silver halide emulsion. The light-sensitive composition can be also prepared using silver halide powders which can be prepared by lyophilization.

The light-sensitive liquid composition of the present invention can be obtained by stirring silver halide and a polymerizable compound which contains the polymer of the invention in dissolved state using a homogenizer, a blender, a mixer or other conventional stirring means. Additional components such as a reducing agent can be added to the composition.

The light-sensitive composition can be used for the preparation of various light-sensitive materials, such as monochromatic or color photographic material, printing material, radiographic material, light-sensitive material for diagnosis (e.g., CRT photographic material for diagnostic device using supersonic wave), and duplicating material (e.g., light-sensitive material for obtaining computer-graphic hard copy).

The process for the preparation of light-sensitive materials using the light-sensitive composition of the invention will be described hereinafter.

The light-sensitive composition is preferably emulsified in an aqueous medium. In the case that the oil droplets of the polymerizable compound is prepared in the form of microcapsules, necessary components for the preparation of the microcapsules, such as the shell wall-forming materials are added in the emulsion, and the emulsion is processed for forming the shell of the microcapsules.

The emulsion of the light-sensitive composition is generally coated on a support to form a light-sensitive layer in the conventional manner.

The present invention is further described by the following examples without limiting the invention.

EXAMPLE 1

Preparation of Silver Halide Emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 56 g of potassium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 $\mu$m and a bromide content of 80 mole %.

The emulsion was washed for desalting and then subjected to chemical sensitization with 5 mg of sodium thiosulfate and 20 mg of 4-hydroxy-6-methyl-1,3,3a,7-tetraazaindene at 60° C. The yield of the emulsion was 600 g.

Preparation of Light-Sensitive Composition

In 10.0 g of trimethylolpropane triacrylate was dissolved 0.04 g of each of the following polymers.

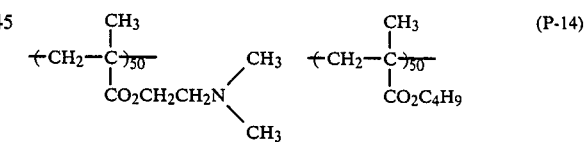
(P-14)

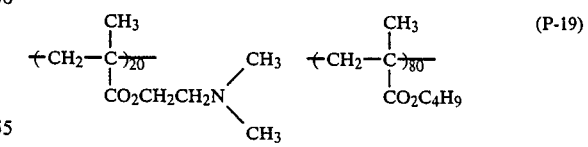
(P-19)

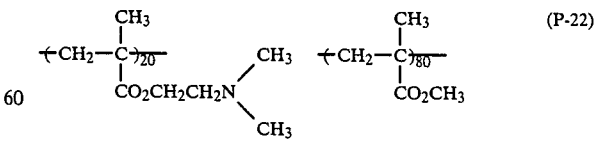
(P-22)

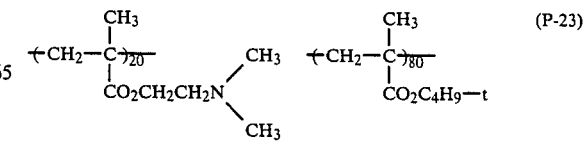
(P-23)

-continued

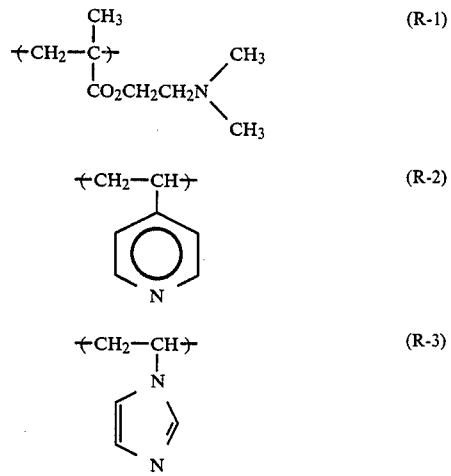

To the solution was added 2.0 g of the silver halide emulsion and the mixture was stirred at 15,000 r.p.m. for 2 minutes to obtain a light-sensitive composition.

The conditions of dispersion of silver halide in the light-sensitive composition was observed using an optical microscope (×800 magnification). The conditions of dispersion was evaluated as following grades: A (finely dispersed), B (partially agglutinated) and C (remarkably agglutinated). The results are set forth in Table 1.

TABLE 1

| Polymer | P-14 | P-19 | P-22 | P-23 | P-24 | P-25 | P-26 | P-27 | P-30 | Q-1 | Q-2 | Q-3 |
|---|---|---|---|---|---|---|---|---|---|---|---|---|
| Dispersion | A | A | A | B | A | A | A | B | A | C | C | C |

It is apparent from the results in Table 1 that the light-sensitive compositions using the polymers of the invention show improved dispersablity for silver halide grains, as compared with those using homopolymers composed of the hydrophobic repeating units alone.

According to further study, it was experimentally confirmed that the following homopolymers composed of hydrophilic repeating units alone could not be dissolved in polymerizable compounds such as trimethylolpropane triacrylate.

EXAMPLE 2

Preparation of Light-Sensitive Composition

Light-sensitive compositions were prepared in the same manner as in Example 1 except that the amount of the silver halide emulsion used was changed to 4.0 g.

The conditions of dispersion of silver halide in each of the light-sensitive compositions was observed in the same manner as in Example 1. The results are set forth in Table 2. In Table 2, the grades A, B and C have the same meanings in Table 1.

TABLE 2

| Polymer | P-14 | P-19 | P-22 | P-23 | P-24 | P-25 | P-26 | P-27 | P-30 | Q-1 | Q-2 | Q-3 |
|---|---|---|---|---|---|---|---|---|---|---|---|---|
| Dispersion | B | A | B | B | B | A | B | B | A | C | C | C |

It is apparent from the results in Table 2 that the light-sensitive compositions using the polymers of the invention show improved dispersablity for silver halide grains, as compared with those using homopolymers composed of the hydrophobic repeating units alone.

As described hereinbefore, the specific polymer employable in the present invention is a polymer having a principal chain consisting essentially of a hydrocarbon chain substituted in part with hydrophilic groups which contain, in their terminal groups, —OH or nitrogen having a lone electron-pair.

The following gives additional examples of the repeating units that can constitute the above-mentioned polymer of the invention.

The repeating units in the polymer can be repeating units having a hydrophilic group which has the formula (IV):

in which each of $R^{11}$, $R^{12}$ and $R^{13}$ individually is a monovalent group selected from the group consisting of hydrogen, methyl and $-CH_2CO_2R^{14}$ ($R^{14}$ is a monovalent group selected from the group consisting of hydrogen, an alkyl group containing 1-6 carbon atoms, an aryl group containing 6-10 carbon atoms and an aralkyl group containing 7-20 carbon atoms); $L^1$ is a divalent group selected from the group consisting of an alkylene group, an arylene group, an aralkylene group, $-CO_2-R^{15}-$ ($R^{15}$ is a divalent group selected from the group consisting of an alkylene group, an arylene group and an aralkylene group) and $-CO-NR^{16}-R^{17}$ (each of $R^{16}$ and $R^{17}$ has the same meaning as that of $R^{14}$ and $R^{15}$, respectively); m is 0 or 1; and $Q^3$ is a monovalent group selected from the group consisting of hydroxyl, $-NR^{18}R^{19}$, $-CONR^{18}R^{19}$, $-NR^{18}COR^{19}$, $-SO_2NR^{18}R^{19}$, $-NR^{18}SO_2R^{19}$ (each of $R^{18}$ and $R^{19}$ individually is hydrogen, an alkyl group and a substituted alkyl group, and $R^{18}$ and $R^{19}$ totally contains not more than 5 carbon atoms, or $R^{18}$ and $R^{19}$ together with the intervening atom or atoms form 5- or 6-membered nitrogen-containing heterocyclic group), and a 5- or 6-membered nitrogen-containing heterocyclic group.

The repeating units in the polymer can be repeating units having a hydrophilic group which has the formula (V):

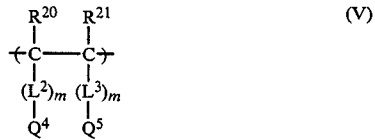

in which each of $R^{20}$ and $R^{21}$ individually has the same meaning as that of $R^{11}$; $L^2$ is $-CO_2-R^{15}-$ or $-CO-NR^{16}-R^{17}$; $L^3$ has the same meaning as that of $L^1$; m is 0 or 1; and each of $Q^4$ and $Q^5$ has the same meaning as that of $Q^3$.

The repeating units in the polymer can be repeating units having a hydrophilic group which has the formula (VI):

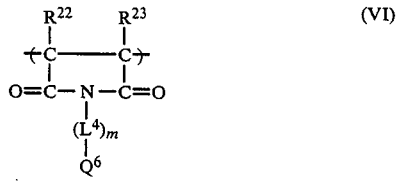

in which each of $R^{22}$ and $R^{23}$ individually has the same meaning as that of $R^{11}$; $L^4$ has the same meaning as that of $L^1$; m is 0 or 1; and $Q^6$ has the same meaning as that of $Q^3$.

We claim:

1. A process for the preparation of a light-sensitive composition in which droplets of a silver halide-in-water emulsion are dispersed in an ethylenically unsaturated polymerizable liquid compound, which comprises the steps of:

dissolving a polymer in the polymerizable compound to prepare a solution, said polymer having a principal chain consisting essentially of a hydrocarbon chain substituted in part with hydrophilic groups which contain, in their terminal groups, —OH or nitrogen atom having a lone electron-pair, and said polymer being used in an amount of 0.01 to 2 weight % based on the amount of the polymerizable compound; and emulsifying the silver halide-in-water emulsion in the solution, said silver halide-in-water emulsion being used in such amount that the amount of the polymerizable compound is in the range of 5 to 120,000 times by weight the amount of silver halide contained in the silver halide-in-water emulsion.

2. The process for the preparation of a light-sensitive composition as claimed in claim 1, wherein the hydrophilic group contains in its terminal group nitrogen having a lone electron-pair, said terminal group having the formula (I):

in which each of $R^1$ and $R^2$ individually is hydrogen or a substituent group, and $R^1$ and $R^2$ totally contain not more than 5 carbon atoms.

3. The process for the preparation of a light-sensitive composition as claimed in claim 2, wherein $R^1$ in the formula (I) is hydrogen.

4. The process for the preparation of a light-sensitive composition as claimed in claim 2, wherein $R^1$ in the formula (I) is $-COR^3$ in which $R^3$ is a substituent group containing not more than 4 carbon atoms.

5. The process for the preparation of a light-sensitive composition as claimed in claim 2, wherein $R^1$ in the formula (I) is $-SO_2R^4$ in which $R^4$ is a substituent group containing not more than 5 carbon atoms.

6. The process for the preparation of a light-sensitive composition as claimed in claim 2, wherein at least one of $R^1$ and $R^2$ in the formula (I) is an alkyl group or a substituted alkyl group containing not more than 5 carbon atoms.

7. The process for the preparation of a light-sensitive composition as claimed in claim 2, wherein $R^1$ and $R^2$ together with the neighboring nitrogen form a 5- or 6-membered heterocyclic group.

8. The process for the preparation of a light-sensitive composition as claimed in claim 1, wherein the hydrophilic groups in the polymer are present in number of at least 0.25% based on the number of carbon atoms contained in the principal chain.

9. The process for the preparation of a light-sensitive composition as claimed in claim 1, wherein the hydrophilic groups in the polymer are present in number of at least 0.5% based on the number of carbon atoms contained in the principal chain.

10. The process for the preparation of a light-sensitive composition as claimed in claim 1, wherein the hydrophilic groups in the polymer are present in number of at least 1% based on the number of carbon atoms contained in the principal chain.

11. The process for the preparation of a light-sensitive composition as claimed in claim 1, wherein the polymer comprises repeating units at least 5% of said units being repeating units having a hydrophilic group which has the formula (II):

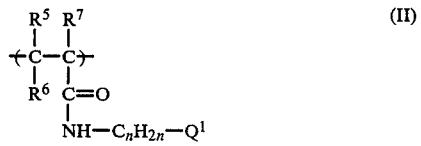

in which each of $R^5$, $R^6$ and $R^7$ individually is hydrogen or methyl; n is an integer of 1 to 6; and $Q^1$ is a monovalent group selected from the group consisting of hydroxyl, amino, an amino group substituted with one or two alkyl groups containing 1-6 carbon atoms, hydroxyphenyl, a 5- or 6-membered nitrogen-containing heterocyclic group, $-COCH_3$ and $-NHSO_2CH_3$.

12. The process for the preparation of a light-sensitive composition as claimed in claim 1, wherein the polymer comprises repeating units at least 5% of said units being repeating units having a hydrophilic group which has the formula (III):

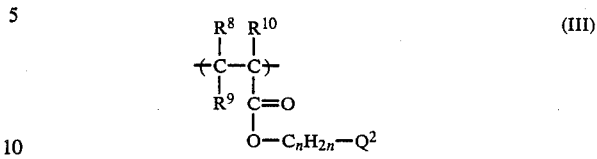

in which each of $R^8$, $R^9$ and $R^{10}$ individually is hydrogen or methyl; n is an integer of 1 to 6; and $Q^2$ is a monovalent group selected from the group consisting of hydroxyl, amino, an amino group substituted with one or two alkyl groups totally containing 1-5 carbon atoms, hydroxyphenyl, a 5- or 6-membered nitrogen-containing heterocyclic group and $-NHSO_2CH_3$.

13. The process for the preparation of a light-sensitive composition as claimed in claim 1, wherein the polymer is used in an amount of 0.1 to 20 weight % based on the amount of the silver halide emulsion.

14. The process for the preparation of a light-sensitive composition as claimed in claim 1, wherein the polymer is used in an amount of 0.05 to 1 weight % based on the amount of the polymerizable compound.

* * * * *

UNITED STATES PATENT AND TRADEMARK OFFICE
CERTIFICATE OF CORRECTION

PATENT NO. : 4,820,610
DATED : April 11, 1989
INVENTOR(S) : Taku NAKAMURA, Tsumoru HIRANO, and Eiji FUNATSU It is certified that error appears in the above-identified patent and that said Letters Patent is hereby corrected as shown below:

On the title page, in item [54], please delete in its entirety and insert therefor --PROCESS FOR PREPARATION OF LIGHT-SENSITIVE POLYMERIZABLE COMPOSITION CONTAINING A SILVER HALIDE IN-WATER EMULSION--.

Signed and Sealed this

Ninth Day of June, 1992

Attest:

DOUGLAS B. COMER

*Attesting Officer*　　*Acting Commissioner of Patents and Trademarks*